United States Patent
Baker et al.

(10) Patent No.: US 6,178,186 B1
(45) Date of Patent: Jan. 23, 2001

(54) FRACTIONAL DECIMATOR WITH LINEAR INTERPOLATION AND METHOD THEREOF

(75) Inventors: James Clark Baker, Crystal Lake; John Paul Oliver, Chicago, both of IL (US)

(73) Assignee: Motorola, Inc., Schaumburg, IL (US)

( * ) Notice: Under 35 U.S.C. 154(b), the term of this patent shall be extended for 0 days.

(21) Appl. No.: 09/049,624

(22) Filed: Mar. 27, 1998

(51) Int. Cl.$^7$ .................................................. H04J 3/06
(52) U.S. Cl. ...................... 370/517; 370/350; 375/354; 708/316
(58) Field of Search .................................... 370/329, 345, 370/350, 498, 503, 516, 517, 519; 708/300, 301, 302, 316; 375/354

(56) References Cited

U.S. PATENT DOCUMENTS

| | | | |
|---|---|---|---|
| 5,060,180 | * 10/1991 | Kingston et al. | 708/306 |
| 5,321,728 | * 6/1994 | Andrieu | 375/354 |
| 5,802,103 | * 9/1998 | Jeong | 375/220 |
| 5,995,520 | * 11/1999 | Uchiki et al. | 370/516 |
| 6,055,248 | * 4/2000 | Kabayashi | 370/517 |
| 6,081,557 | * 6/2000 | Suemura et al. | 375/259 |

OTHER PUBLICATIONS

U.S. application Ser. No. 08/659,104, filed on May 31, 1996, in the name of Motorola, Inc., entitled: "Bit Serial Digitial Compressor".
U.S. application Ser. No. 08631,321, filed in Apr. 10, 1996, in the name of Motorola, Inc., entitled: "Method and Apparatus For Setting a Bit–Serial Filter to an All–Zero State".

* cited by examiner

Primary Examiner—Ajit Patel
Assistant Examiner—Bob A. Phunkula
(74) Attorney, Agent, or Firm—Paul J. Bartusiak

(57) ABSTRACT

According to the present disclosure, an parallel formatted data signal is applied to an input (300), and the data signal is divided into a first data signal and a second data signal. The second data signal is applied to a logic delay element (606) to produce a delayed second data signal that is a delayed-in-time version of the first data signal. The first data signal is applied to a first parallel-to-serial converter (706), the delayed second signal is applied to a second parallel-to-serial converter (708), and first and second bit-serial data streams are produced. A controller (710) synchronizes an Arithmetic Logic Unit (616) to the first and second bit-serial data streams so that the ALU (616) scales and sums the first and second bit-serial data streams to produce a bit-serial, sample-rate converted, output signal.

20 Claims, 5 Drawing Sheets

— PRIOR ART —

— PRIOR ART —

— PRIOR ART —

FRACTIONAL DECIMATOR WITH LINEAR INTERPOLATION AND METHOD THEREOF

FIELD OF THE INVENTION

This invention relates generally to digital signal processing, and more particularly to a fractional decimator with linear interpolation.

BACKGROUND OF THE INVENTION

In radiotelephone communication systems, proper operation generally requires the transmission of control signals along with the desired voice or data signal. The control signals are used, for example, to page or call a mobile subscriber unit, and to perform a handshaking procedure between the mobile subscriber unit and the remote base station. Two signal types that play an important role in the handshaking procedure of the cellular Advanced Mobile Phone System (AMPS) are the Supervisory Audio Tone (SAT) signal and the Supervisory Tone (ST) signal.

The SAT signal generally serves two functions. First, it enables cellular base stations in one particular cluster of cells to be distinguished from base stations in a neighboring cluster of cells that use the same channel frequencies. A mobile subscriber unit is therefore constrained to operate with the base stations in its vicinity even though it could also be receiving an adjacent cluster signal because the adjacent cluster signal will have an incorrect SAT. Second, the SAT signal makes a closed loop identification between the mobile subscriber unit and the base station. If the SAT is lost during a call, the base station a timer. If the SAT signal is not received before the time expires, the call is terminated.

Some of the functions of the ST signal are to confirm a handover request, to send a request for additional services, and to send confirmation of an alert after the mobile subscriber unit has been alerted.

The AMPS cellular telephone standard requires a 10 Kbit/sec data signal to be intermittently transmitted by the subscriber unit. The data signal is Manchester encoded to produce a High Speed Data (HSD) signal at a sample rate of 160 Ksamples/sec. The ST signal is derived from the HSD signal and therefore also has a sample rate of 160 Ksamples/sec. When the data is not being transmitted, the audio (voice) signal can be transmitted. The sample rate of the audio signal after digital processing is 128 Ksamples/sec. The supervisory audio tone (SAT) has a sample rate of 128 Ksamples/sec.

In addition, during certain transmission times, it is necessary to simultaneously send the supervisory audio tone (SAT) and the supervisory tone (ST). Therefore, the transmission of signals in the AMPS cellular standard generally involves three conditions. Condition one is when the audio signal (128 Ksamples/sec) is simultaneously transmitted with the SAT signal (128 Ksamples/sec). Condition two is when the HSD signal (160 Ksamples/sec) is transmitted. Condition three is when the ST signal (160 Ksamples/sec) is simultaneously transmitted with the SAT signal (128 Ksamples/sec).

In order to simultaneously transmit the ST and SAT signals, the ST signal is summed with the SAT signal. The ST signal and the SAT signal are routed to a common modulator circuit, so it is important that the sampling rate of the two signals be substantially equal at the modulator interface.

One possible method to get the sampling rates of the ST and the SAT signals to be substantially equal is to convert the SAT signal from 128 Ksamples/sec to 160 Ksamples/sec. This approach, however, would still result in signals interfacing with the modulator at more than one sample rate. For example, during condition one transmission, the audio signal would be at 128 Ksamples/sec and the SAT signal would be at 160 Ksamples/sec. However, this approach would lead to more circuit complexity due to the need to interface the modulator to two sampling rates.

Thus, converting the SAT signal sample rate would require extra circuitry to account for the signals at the two sample rates and would not result in the most reduced complexity circuitry that is optimized to reduce the die area of an integrated circuit (IC). Further, the approach would not yield the lowest current drain solution. A reduction in IC area would result in an overall reduction in the size and cost of a radiotelephone that incorporates the IC, and a reducing the size of a radiotelephone is very desirable feature. Lowering the current drain of radiotelephone circuitry is also desirable because lower current drain translates into a longer period of sustainable operation. Therefore, there is a need to convert the HSD signal, including the ST signal, from a sample rate of 160 Ksamples/sec to 128 Ksamples/sec. This would result in a single sample rate being presented to the modulator interface during all three conditions of transmission.

One possible method to achieve the sample rate conversion is through the use of a linear decimator based on a Finite-duration Impulse Response (FIR) filter. This conventional approach, however, results in a complex design which does not result in the most reduced circuit complexity or the lowest current drain. Prior art methods require an additional high-speed clock, which further increases current drain, circuit complexity, and required silicon area of an integrated circuit. Much of the prior art circuitry also operates at the high clock speed, thus further increasing current drain. Therefore, there is a need to accomplish the sample rate conversion with a minimal amount of hardware in order to not have a significant impact on the size and cost of a radiotelephone mobile subscriber unit. There is a further need to perform the sample rate conversion without the need for an additional high speed clock and its associated circuitry.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

A fractional decimator with linear interpolation generally comprises a first parallel-to-serial converter, a second parallel-to-serial converter, a delay element, a controller, and an arithmetic logic unit (ALU). A data sequence needing a sample rate conversion is divided into two paths. Data on a first path is applied to the first parallel-to-serial converter. Data on a second path is first applied to the delay element and then applied to the second parallel-to-serial converter. The data produced at the output of the parallel-to-serial converters, in the form of two's complement, bit-serial data, is applied to the ALU. The controller synchronizes the ALU to the past and present states of the input data sequence in order for the ALU to scale and sum the past and present values of the input data sequence to produce two's complement, bit-serial data at a linearly decimated data rate at an output of the ALU.

Figure 1:
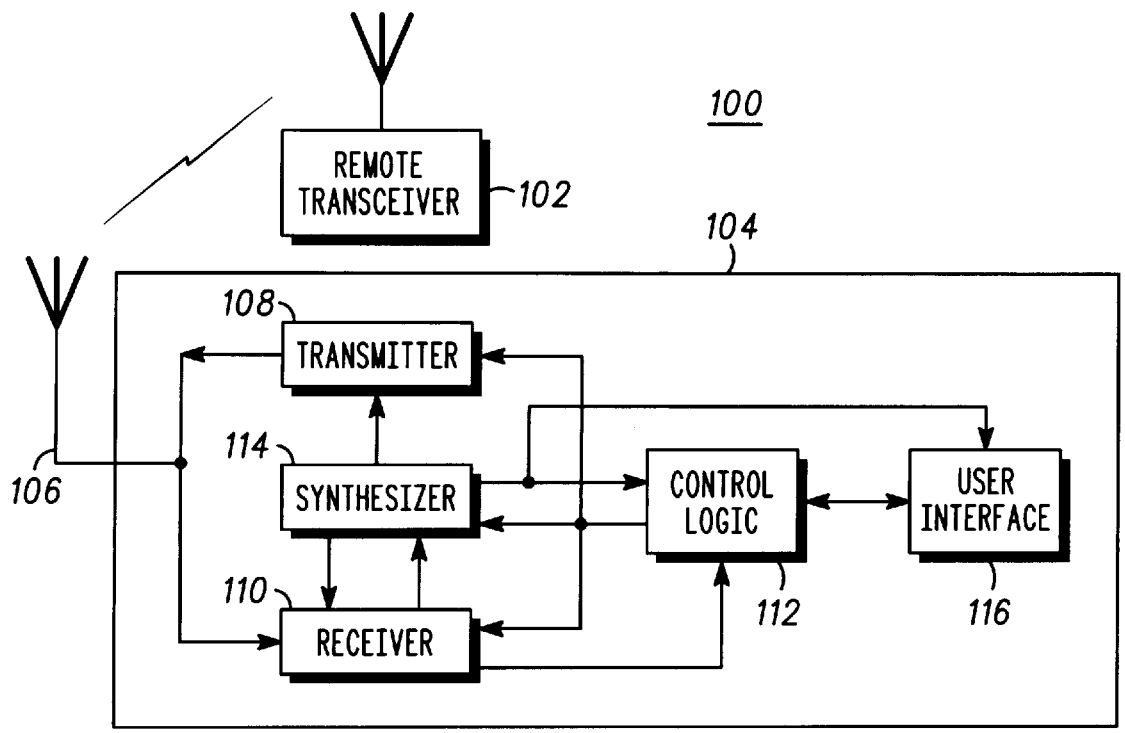
FIG. 1 is a block diagram of a radiotelephone which may employ a fractional decimator with linear interpolation.

FIG. 1 is an illustration in block diagram from of a radiotelephone communication system 100. The radiotelephone communication system 100 includes a remote transceiver 102 and one or more radiotelephones such as radiotelephone 104. The remote transceiver 102 sends and receives RF signals to and from radiotelephones within a fixed geographic area. The radiotelephone 104 is one such radiotelephone contained within the geographic area and includes an antenna 106, a transmitter 108, a receiver 110, a control logic 112, a synthesizer 114, and a user interface 116.

To transmit RF signals containing transmit data (such as voice, digital information, or control signals) from the radiotelephone 104 to the remote transceiver 102, the user interface 116 directs user input data to the control logic 112. The control logic 112 typically includes a microprocessor, memory, a clock generator, and a power amplifier control circuit. The control logic 112 formats the transmit data obtained from the user interface 116 and conveys it to the transmitter 108 for conversion into RF modulated signals. The transmitter 108 conveys the RF modulated signals to the antenna 106 for transmission to the remote transceiver 102.

The radiotelephone 104 detects RF signals containing receive data through the antenna 106 and produces detected RF signals. The receiver 110, coupled to the antenna 106, converts the detected RF signals into electrical baseband signals, demodulates the electrical baseband signals, recovers the receive data, including automatic frequency control information, and outputs the receive data to the control logic 112. The control logic 112 formats the data into recognizable voice or data information for use by user interface 116. The user interface 116 communicates the received information or voice to a user. Typically, the user interface 116 includes a microphone, a speaker, a display, and a keypad. The receiver 110 also receives a SAT signal from the remote transceiver 102, filters and process the SAT signal, and relays the SAT signal to the transmitter 108 for transmission back to the remote transceiver.

The synthesizer 114 generates RF signals for use by the receiver 110 and the transmitter 108 to allow the reception and transmission of data. Control over functions of the transceiver, such as channel of operation frequency, is provided by the control logic 112, and is applied, in part, to the synthesizer 114 as synthesizer program instructions.

Figure 2:
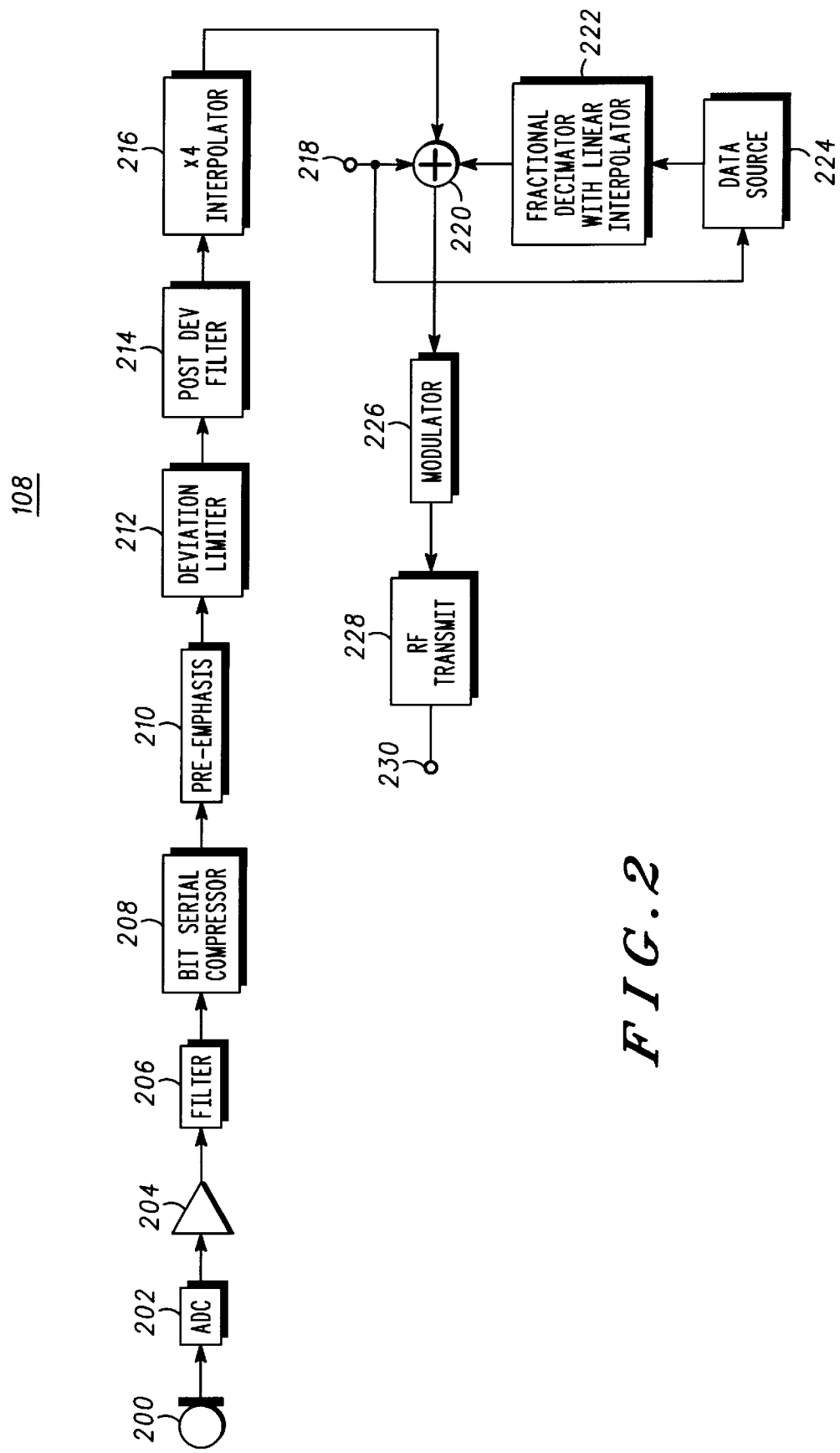
FIG. 2 is a block diagram of a radiotelephone transmitter employing a fractional decimator in accordance with the present invention.

A basic block diagram of the transmitter 108 employing the fractional decimator with linear interpolation 222 is generally shown in FIG. 2. Although the illustrated embodiment of the radiotelephone communication system 100 has a transmitter 108 and a receiver 110, the fractional decimator with linear interpolation can be used in any device requiring a decimator. For example, the fractional decimator with linear interpolation can be employed in a MODEM (modulator/demodulator), two-way radios, land-line telephones, recording instruments, cellular telephones, cordless telephones, radio frequency transmitters, or the like.

The transmitter 108 includes an analog-to-digital converter (ADC) 202 for receiving electrical signals from microphone 200. The ADC 202 converts the analog electrical signals from the microphone 200 into serial data. The output of the ADC 202 is applied to an amplifier 204 that has its gain set to help protect against overflow in a bandpass filter 206.

The output of amplifier 204 is connected to the bandpass filter 206 to remove noise and undesired signals. The bandpass filter 206 may, for example, pass only frequency components between approximately 300 Hz and 3 KHz, thereby removing frequency components that are substantially outside of the voice band.

The output of the bandpass filter 206 is connected to a bit-serial compressor 208. The bit-serial compressor generally includes a divider, overflow detection and control, an absolute value circuit, a low pass filter, and level detection and control. The bit-serial compressor 208 is designed to mimic the performance of conventional compressors that are used for AMPS. An input to the bit-serial compressor 208 that is below a pre-set threshold will produce a unitary gain to prevent low level noise from being greatly amplified. In one embodiment, the bit-serial compressor 208 is similar to the bit-serial compressor disclosed in U.S. patent application Ser. No. 08/659,104 filed on May 31, 1996, which is commonly assigned to the assignee of the present invention and which is incorporated herein by reference.

The output of the bit-serial compressor 208 is processed for transmission in a pre-emphasis filter 210, limited in a limiter 212, and filtered in post deviation filter 214. The data signal at the output of the post deviation filter 214 is at a sample rate of 32 Ksamples/sec in the illustrated embodiment. The data signal is applied to a conventional interpolator 216 to multiply the sample rate of the data signal to 128 Ksamples/sec.

The data signal with the multiplied sample rate is applied to a summing circuit 220. Also applied to the summing circuit 220 is the SAT signal appearing at input 218. The SAT signal is at a sample rate of 128 Ksamples/sec, and is produced by the receiver 110 in combination with control logic 112.

The HSD signal, which incorporates the ST signal and is at a sample rate of 160 Ksamples/sec, is produced by a conventional data generator 224. Conventional data generator 224 generates the HSD signal that is filtered in order to meet spectral requirements. The filtering process within the conventional data generator 224 can be accomplished by several methods, such as a conventional Bessel filter or a look-up table. The HSD signal is applied to the fractional decimator with linear interpolation 222 to convert the sample rate to 128 Ksamples/sec. The HSD signal is then applied to the summing circuit 220. The composite signal produced at the output of the summing circuit 220 is applied to modulator 226, and then to a Radio Frequency (RF) transmitter block 228. The RF transmitter block 228 can include a frequency conversion mixer, RF gain stages, a variable gain amplifier, filtering, and a power amplifier. After signal conditioning by the RF transmit block 228, the signal to be transmitted is produced at output 230, and the transmit signal is then transmitted through antenna 106.

Figure 3:
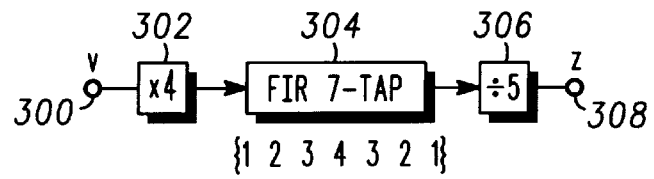
FIG. 3 illustrates a fractional decimator that utilizes a seven-tap Finite-duration Impulse Response (FIR) filter.

FIGS. 3–6 illustrates the derivation from a conceptual network for a fractional decimator with linear interpolation that leads to the hardware realization in accordance with the present invention. FIG. 3 illustrates a fractional decimator that utilizes a seven-tap Finite-duration impulse response (FIR) filter. The input signal, here shown as v, is applied to an a M-times zero-stuff interpolator 302 through input 300. Zero-stuff interpolation involves inserting (M-1) zero values between existing data values. The output of the zero-stuff interpolator 302 is applied to the seven-tap FIR filter 304, and the resulting signal is applied to a decimator block 306 to produce the desired sample rate converted signal z, at output 308.

Figure 4:
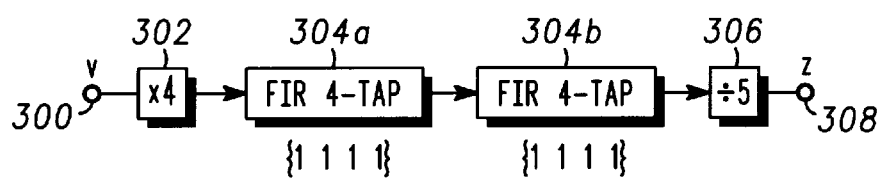
FIG. 4 illustrates how a seven-tap FIR filter can be decomposed into two cascaded four-tap FIR filters with unity tap coefficients.

FIG. 4 illustrates how the seven-tap FIR filter can be decomposed into two cascaded four-tap FIR filters with unity tap coefficients. The input signal v is applied to the zero-stuff interpolator 302 through input 300, and the output of the zero-stuff interpolator 302 is applied to a first four-tap FIR filter 304a. The output of the first FIR filter 304a is applied to a second FIR filter 304b, and the resulting signal is applied to the decimator block 306 to produce the desired sample rate converted signal z at output 308.

Figure 5:
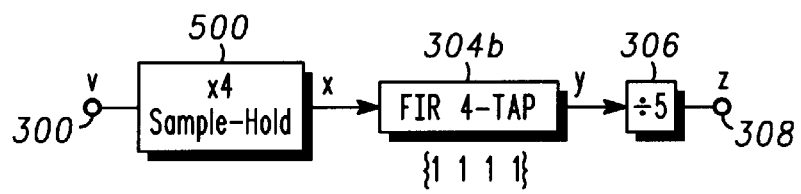
FIG. 5 illustrates how the decimator configuration of FIG. 3 can be realized utilizing a sample-and-hold interpolator block.

Logically, the combination of the zero-stuff interpolator 302 followed by a four-tap FIR filter is substantially equivalent to a single sample-and-hold interpolator block. FIG. 5 illustrates how the decimator configuration of FIG. 3 can be realized utilizing a sample-and-hold interpolator block. The input signal v is applied to a sample-and-hold interpolator block 500 through input 300, and the resulting output is applied to the remaining second FIR filter 304b. The output of the second FIR filter 304b is applied to the decimator block 306 to produce the desired sample rate converted signal z at output 308.

An example of the input, first intermediate, second intermediate, and output signal values, v, x, y, and z, respectively, are listed in TABLE 1. Each row represents a time increment equivalent to a 640 Ksamples/sec rate. A 640 Ksamples/sec time increment is listed since, in the illustrated embodiment, the input signal v is at a sample rate of 160 Ksamples/sec, and the sample-and-hold interpolator block 500 comprises a multiplication factor of four.

The output signal value z is dependent only on a combination of the past and present input signal value v applied to the input 300, and the output signal z is a repetitious pattern. In addition, for five input signal values v, there are four output signal values z. This demonstrates the sample rate conversion from 160 Ksamples/sec to 128 Ksamples/sec.

TABLE 1

Input, output, and intermediate signal values corresponding to FIG. 5.

| Input: Signal v | Output of X4 Sample and Hold: Signal x | Output of Four-Tap FIR: Signal y | Output of /5 Decimator: Signal z |
|---|---|---|---|
| $v_1$ | $v_1$ | $1v_1$ | |
|  | $v_1$ | $2v_1$ | |
|  | $v_1$ | $3v_1$ | |
|  | $v_1$ | $4v_1$ | $4v_1$ |
| $v_2$ | $v_2$ | $1v_2 + 3v_1$ | |
|  | $v_2$ | $2v_2 + 2v_1$ | |
|  | $v_2$ | $3v_2 + 1v_1$ | |
|  | $v_2$ | $4v_2$ | |
| $v_3$ | $v_3$ | $1v_3 + 3v_2$ | $1v_3 + 3v_2$ |
|  | $v_3$ | $2v_3 + 2v_2$ | |
|  | $v_3$ | $3v_3 + 1v_2$ | |
|  | $v_3$ | $4v_3$ | |
| $v_4$ | $v_4$ | $1v_4 + 3v_3$ | |
|  | $v_4$ | $2v_4 + 2v_3$ | $2v_4 + 2v_3$ |
|  | $v_4$ | $3v_4 + 1v_3$ | |
|  | $v_4$ | $4v_4$ | |
| $v_5$ | $v_5$ | $1v_5 + 3v_4$ | |
|  | $v_5$ | $2v_5 + 2v_4$ | |
|  | $v_5$ | $3v_5 + 1v_4$ | $3v_5 + 1v_4$ |
|  | $v_5$ | $4v_5$ | |
| $v_6$ | $v_6$ | $1v_6 + 3v_5$ | |
|  | $v_6$ | $2v_6 + 2v_5$ | |
|  | $v_6$ | $3v_6 + 1v_5$ | |
|  | $v_6$ | $4v_6$ | $4v_6$ |
| $v_7$ | $v_7$ | $1v_7 + 3v_6$ | |
|  | $v_7$ | $2v_7 + 2v_6$ | |
|  | $v_7$ | $3v_7 + 1v_6$ | |
|  | $v_7$ | $4v_7$ | |
| $v_8$ | $v_8$ | $1v_8 + 3v_7$ | $1v_8 + 3v_7$ |

The prior art method shown in FIG. 5 involves the use of clock speeds that are four times the clock speed associated with the input signal. This use of a high speed clock greatly increases current drain and requires additional clock circuitry, thereby increasing circuit complexity and the silicon area 10 needed on an integrated circuit. Much of the circuitry shown in FIG. 5 also operates at the higher clock speed, which further increases current drain. Therefore the hardware realization is considerably simplified when direct computations of the output signal z (column four of TABLE 1) are calculated by a fractional decimator with linear interpolation in accordance with the present invention.

Figure 6:
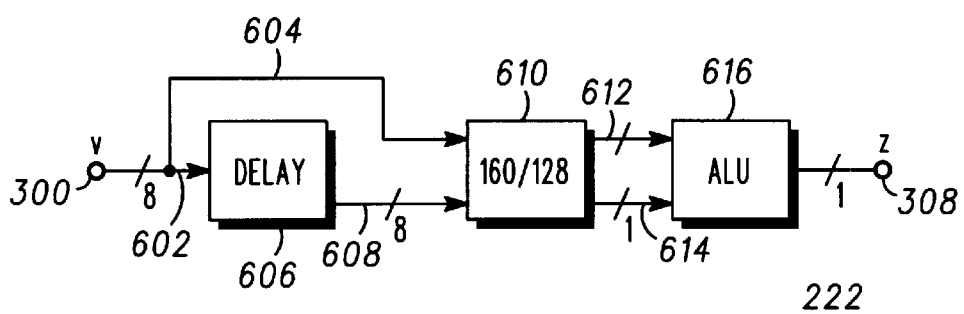
FIG. 6 is a block diagram of a reduced complexity fractional decimator that incorporates direct computation of an output signal in accordance with the present invention.

FIG. 6 is a block diagram of a reduced complexity fractional decimator that incorporates direct computation of the output signal in accordance with the present invention. The input signal v in the illustrated embodiment comprises eight-bit parallel 160 Ksamples/sec HSD. This input signal is first divided into two signal paths. The input signal v appearing on a first signal path 604, also referred to as a first portion of the input signal, is applied directly to a combinational logic block 610. The input signal v appearing on a second signal path 602, also referred to as a second portion of the input signal, is applied to a delay element 606 to produce a delayed version of the input signal that is also referred to as a delayed second portion of the input signal. The delayed version of the input signal produced on line 608 is then applied to the combinational logic block 610.

The combinational logic block 610 converts the eight-bit parallel 160 Ksamples/sec HSD to 128 Ksamples/sec bit-serial data. The conversion to bit-serial data generally means that originally parallel data, suitable for transmission as a single word over a multi-line bus, is reformatted for bit-by-bit serial transmission on, for example, a single line. The conversion of parallel data to bit-serial data allows for reduced complexity logic circuitry that ultimately leads to current savings, area savings on an integrated circuit, and thus cost savings. The resulting 128 Ksamples/sec bit-serial data produced on lines 612 and 614 is applied to an Arithmetic Logic Unit 616 for processing, and the output signal is produced at output 308.

Figure 7:
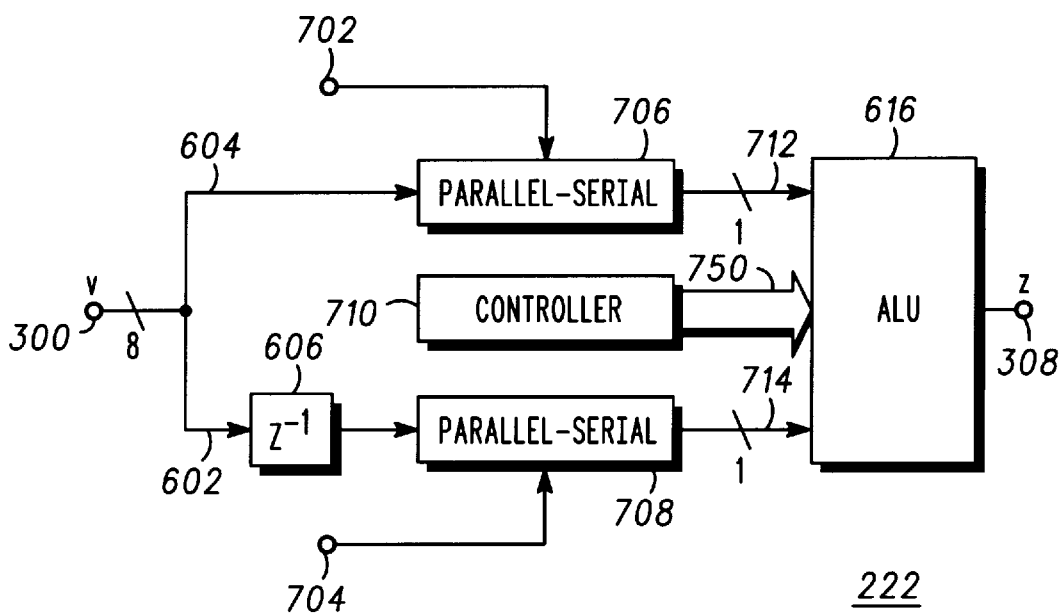
FIG. 7 illustrates a hardware implementation of a fractional decimator with linear interpolation in accordance with the present invention.

FIG. 7 illustrates a hardware implementation of the fractional decimator with linear interpolation 222 shown in the block diagram of FIG. 6. In the illustrated embodiment, the input signal v appearing at the input 300 is shown to comprise eight-bit parallel, 160 Ksamples/sec HSD. The input signal is divided into two signal paths. A first portion of the input signal v appearing on a first signal path 604 is applied directly to a first parallel-to-serial converter 706. A second portion of the input signal v appearing on a second signal path 602 is applied to a conventional eight-bit logic delay element 606, and the delayed version of the input signal is then applied to a second parallel-to-serial converter 708. The first parallel-to-serial converter 706 and the second parallel-to-serial converter 708 generally comprise combinational logic and flip-flop circuitry.

A load data signal that is generated by a bit-serial controller portion of the control logic 112 (FIG. 1) is applied to an input 702 of the first parallel-to-serial converter 706 and to an input 704 of the second parallel-to-serial converter 708. In the illustrated embodiment, the load data signal operates at 128 KHz, and it is asserted high for $\frac{1}{15}$ of a load data signal period. With the load data signal operating at 128 KHz, the parallel-to-serial converters will load an eight-bit parallel word (i.e. the input signal v) at a rate of 128 KHz. Since the load data signal is asserted high for $\frac{1}{15}$ of the load data signal period, the parallel-to-serial converters produce fifteen bits of serial data at a bit rate of (15 bits/sample)×(128 Ksamples/sec)=1.92 Mbits/sec. For example, the first parallel-to-serial converter 706 converts the eight-bit parallel, two's complement, 160 Ksamples/sec HSD to fifteen-bit, two's complement, bit-serial data at a bit rate of 1.92 Mbits/sec that appears on line 712. Likewise, the second parallel-to-serial converter 708 converts the eight-bit parallel, two's complement, 160 Ksamples/sec HSD to fifteen-bit, two's complement, bit-serial data at a bit rate of 1.92 Mbits/sec on line 714 that is a delayed version of the signal produced on line 712. The sample rate of the fifteen-bit, bit-serial data corresponding to the 1.92 Mbits/sec bit rate is 128 Ksamples/sec. Thus, the bit-serial data streams appearing on lines 712 and 714 are at a sample rate that is a fractional multiple of the original sample-rate of the parallel formatted data signal applied at the input 300.

The resulting 1.92 Mbits/sec bit-serial data produced on lines 712 and 714, along with a control signal produced by controller 710, are applied to a circuit, here shown as an Arithmetic Logic Unit (ALU) 616. In the illustrated embodiment, the controller 710 is a four-state controller comprising a two-bit up-counter. The controller synchronizes the ALU 616 to the past and present values of the input signal that appear on lines 712 and 714, respectively. The ALU 616 scales and sums the past and present values of the input signal v, as illustrated in TABLE 1, to produce fifteen-bit, two's complement, bit-serial data at a sample rate of 128 Ksamples/sec at output 308. Thus, the fractional decimator with linear interpolation 222 produces an output signal with a sample rate that is a fraction of an input signal sample rate.

Figure 9:
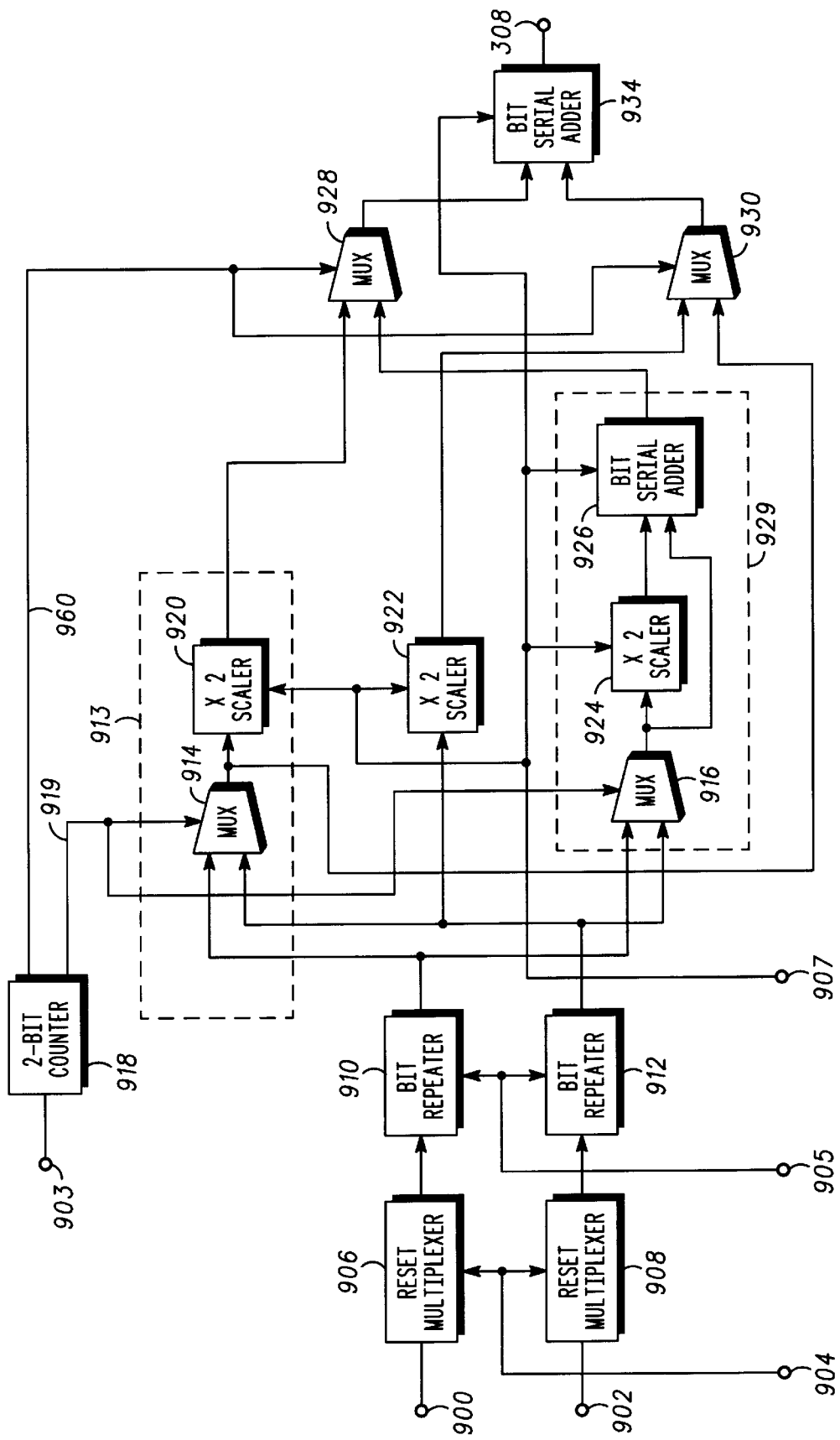
FIG. 9 is a block diagram of a reduced complexity ALU in accordance with the present invention.

FIG. 9 is a block diagram of a reduced complexity ALU 616 in accordance with the present invention. A first portion of the control signal produced by the controller 710 on bus 750 (FIG. 7) is coupled to an input 903 and applied to a standard two-bit counter 918. The two-bit counter 918 produces a most significant bit (MSB) control signal on line 919 and a least significant bit (LSB) control signal on line 960.

A first portion of the input signal, the 1.92 Mbits/sec bit-serial data produced on line 712, is applied to input 900 and coupled to a first reset multiplexer 906. A second portion of the input signal, the 1.92 Mbit/sec bitserial data produced on line 714 that is a delayed version of the signal produced on line 712, is applied to input 902 and coupled to a second reset multiplexer 908.

In one embodiment, the first reset multiplexer 906 and the second reset multiplexer 908 are similar to the apparatus for setting a bit-serial filter to an all-zero state that is disclosed in U.S. patent application Ser. No. 08/631,321 filed on Apr. 10, 1996, which is commonly assigned to the assignee of the present invention. The first reset multiplexer 906 and the second reset multiplexer 908 each comprise a reset gate. When a reset portion of the control signal produced by the controller 710 on bus 750 (FIG. 7) is applied through input 904 to the first reset multiplexer 906 and the second reset multiplexer 908, each reset multiplexer causes an asserted low signal to appear at its output. The first reset multiplexer 906 and the second reset multiplexer 908 thus comprise an ALU reset circuit that is used for start-up initialization of the ALU 616.

The first reset multiplexer 906 and the second reset multiplexer 908 allow the ALU 616 to be reset without using flip-flops and therefore results in reduced circuit complexity. Alternatively, other mechanisms that generate an asserted low signal can be used as the reset multiplexers. For example, switches, multiplexers, or other logic gate configurations may be used to set the Bit-Serial repeaters to an all zero state.

The output of the first reset multiplexer 906 is applied to a first bit-repeater 910, and the first bit-repeater 910 scales the first portion of the input signal by $\frac{1}{4}$. The output of the second reset multiplexer 908 is applied to a second bit-repeater 912, and the second bit-repeater 912 scales the second portion of the input signal by $\frac{1}{4}$. The least significant bit (LSB) arrival of each word is indicated using part of the second portion of the control signal produced by the controller 710 on bus 750 (FIG. 7) that is applied to input 905, and the scaling coefficient of $\frac{1}{4}$ is set using another part of the second portion of the control signal.

Thus the first bit-repeater 910 is for scaling the first portion of the input signal to produce a scaled first portion of the input signal, and the second bit-repeater 912 is for scaling the second portion of the input signal to produce a scaled second portion of the input signal. This initial scaling of the bit-serial data signals prevents signal overflow which would otherwise result from the subsequent addition and multiplication of the input signals. In the illustrated embodiment, a bit repeater repeats the sign bit of a bit-serial data signal in order to achieve a properly scaled signal. The first bit-repeater 910 produces a Present signal, and the second bit-repeater 912 produces a Past signal.

The Present signal is applied to a times-two circuit 913 and a times-three circuit 929. The Past signal is applied to the times-two circuit 913, a times-two Past circuit 922, and the times-three circuit 929.

In the illustrated embodiment, the times-two circuit 913 comprises a times-one circuit 914 and a bit-serial scaler 920. The times-two circuit 913 is for producing both a times-one Past-Present signal and a times-two Past-Present signal. The times-one circuit 914 uses the MSB control signal to select from its input signals and produce the times-one Past- Present signal in response to the MSB control signal. Depending upon the polarity of the MSB signal, the times-one circuit 914 will alternatively produce the Present signal and the Past signal as the output times-one Past-Present signal.

The bit-serial scaler 920 produces a times-two scaled signal of the signal presented at its input. For example, when the times-one circuit 914 presents the Past signal to the input of the bit-serial scaler 920, a times-two scaled Past signal is produced by the times-two circuit 913 in response to a third portion of the control signal produced by controller 710 at input 907. When the times-one circuit 914 presents the Present signal to the input of the bit-serial scaler 920, a times-two scaled Present signal is produced at the times-two circuit 913 output in response to the third portion of the control signal produced by controller 710 at input 907.

In the illustrated embodiment, the times-one circuit 914 comprises a standard mulitplexer well known in the art. It will be recognized by those skilled in the art that other circuit combinations can be used to produce times-one scaled and a times-two scaled representations of signals.

The times-three circuit 929 comprises a multiplexer 916, a bit-serial scaler 924, and a bit serial adder 926. The times-three circuit 929 is for producing a times-three Past-Present signal in response to the third portion of the control signal and the MSB control signal. For example, the multiplexed signal produced by the multiplexer 916 and a times-two scaled multiplexed signal produced by the bit-serial scaler 924 are applied to the bit-serial adder 926. When the multiplexer 916 selects the Present signal to appear at the multiplexer 916 output in response to the MSB control signal, a times-three scaled Present signal is produced at the output of the times-three circuit in response to a third portion of the control signal produced by controller 710 at input 907. Alternatively, when the multiplexer 916 selects the Past signal to appear at the multiplexer 916 output, a times-three scaled Past signal is produced at the output of the times-three circuit 929 in response to a third portion of the control signal produced by controller 710 at input 907. It will be recognized by those skilled in the art that other circuit combinations can be used to produce a times-three scaled representation of signals.

A times-two Past circuit 922 produces a times-two Past signal in response to the third portion of the control signal. In the illustrated embodiment, the times-two Past circuit 922 comprises a bit-serial scaler. It will be recognized by those skilled in the art that other circuit combinations can be used to produce a times-two scaled representation of input signals.

The times-two Past-Present signal and the times-three Past-Present signal are applied to a first output multiplexer 928 to produce a first intermediate signal in response to the LSB control signal on line 960. The times-two Past signal and the times-one Past-Present signal are applied to a second output multiplexer 930 to produce a second intermediate signal in response to the LSB control signal. The first intermediate signal and the second intermediate signal are added together with a bit-serial adder 934 to produce a 128 Ksamples/sec signal at the output 308. The third portion of the control signal produced by the controller 710 on bus 750 (FIG. 7) is applied to input 907 for control of the times-two Past circuit 922, the bit-serial scaler 920, the bit-serial scaler 924, the bit-serial adder 926, and the bit-serial adder 934.

The illustrated embodiment shows a four/fifths fractional decimator with linear interpolation. It will be recognized by those skilled in the art that other ratios of fractional decimation can be accomplished with the application of the present invention. Thus, the fractional decimator with linear interpolation 222 can be generalized to an M/N (where M and N are integers, M<N) fractional decimator with linear interpolation. In addition, the illustrated embodiment comprises a sample rate conversion from 160 Ksamples/sec to 128 Ksamples/sec. It will be recognized that other conversion rates are possible with the present invention.

Figure 8:
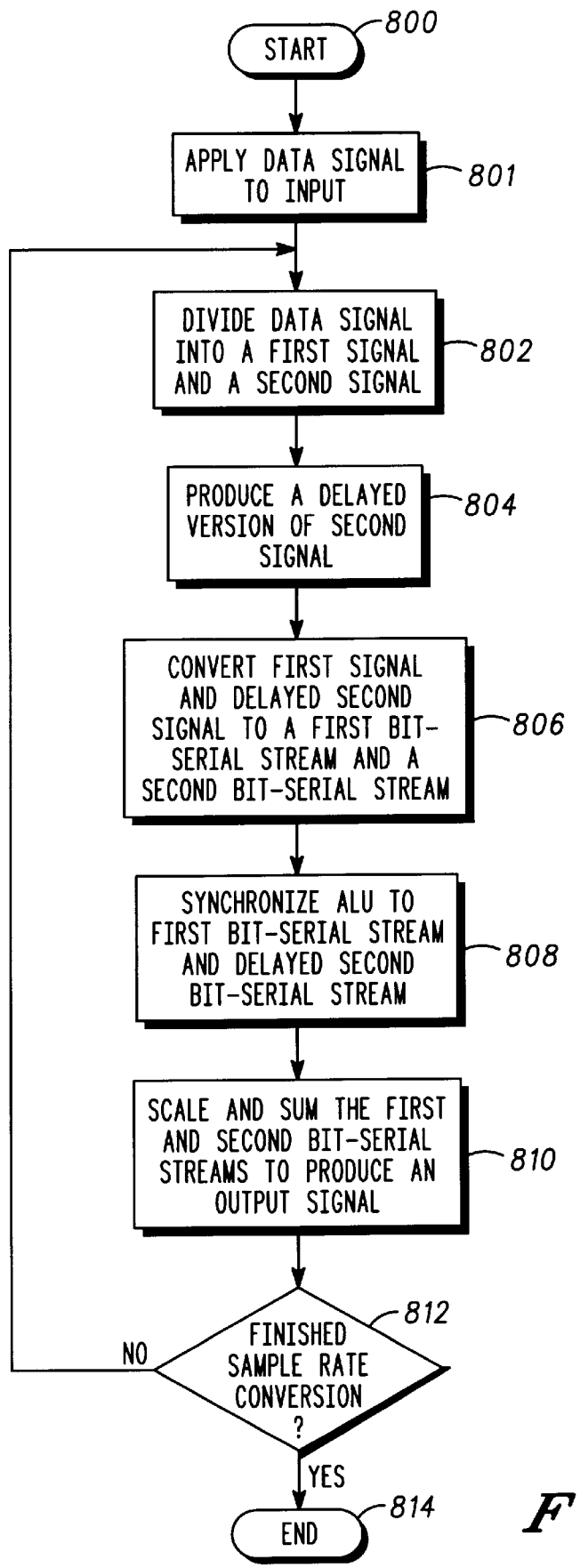
FIG. 8 is a flow chart illustrating a method of fractional decimation with linear interpolation.

FIG. 8 is a flow chart illustrating a method of fractional decimation with linear interpolation. The method starts at block 800, and at block 801 a parallel formatted data input signal is applied to an input of the fractional decimator with linear interpolation. At block 802, the data signal is divided into a first data signal and a second data signal, and at block 804 the second data signal is applied to a logic delay element to produce a delayed second signal that is a delayed-in-time version of the first data signal.

At block 806 the first data signal is applied to a first parallel-to-serial converter and the delayed second signal is applied to a second parallel-to-serial converter. The first data signal is converted to a first bit-serial data stream and the delayed second signal is converted to a second bit-serial data stream. The first bit-serial data stream and the second bit-serial data stream are each at sample rates that are a rational multiple of the original sample-rate of the parallel formatted data signal that was applied to the input.

At block 808 the first bit-serial data stream and the second bit-serial data stream are applied to an ALU, and a controller synchronizes the ALU to the to the first bit-serial data stream and the second bit-serial data stream. At block 810 the ALU scales and sums the first bit-serial data stream and the second bit-serial data stream to produce an output signal that is two's complement bit-serial data at a converted sample rate.

If at block 812 the fractional decimation and linear interpolation of the input signal is not completed, the process continues, starting at block 802. If the fractional decimation with linear interpolation is completed, the procedure is ended at block 814.

A fractional decimator with linear interpolation in accordance with the present invention has several advantages over conventional fractional decimators with linear interpolation that are implemented with a FIR filter. The circuit complexity is greatly reduced as compared to the circuit complexity involved with a conventional FIR filter implementation. The reduced circuit complexity advantageously reduces the area needed on an IC that comprises fractional decimation with linear interpolation, and the manufacturing cost of a device that incorporates the IC is reduced. The reduced circuit complexity results in lower current drain, which advantageously increases the operation time of a portable communication device, such as a radiotelephone.

The previous description of the preferred embodiments are provided to enable any person skilled in the art to make or use fractional decimator with linear interpolation. Various modifications to these embodiments will be readily apparent to those skilled in the art, and the generic principles defined herein may be applied to other embodiments without the use of the inventive faculty. For example, the transmitter architecture described here is that of an FM communication system with digital baseband processing. The fractional decimator with linear interpolation can also be used in conjunction with other communication systems, such as digital time-division multiple access and code-division multiple access systems.

What is claimed is:

1. A fractional decimator with linear interpolation comprising:
   a first parallel-to-serial converter configured to receive a first portion of an input signal, the first parallel-to-serial converter to produce a first bit-serial data stream;
   a delay element configured to receive a second portion of the input signal, the delay element to produce a delayed second portion of the input signal;
   a second parallel-to-serial converter configured to receive the delayed second portion of the input signal, the second parallel-to-serial converter to produce a second bit-serial data stream;
   a controller for producing a control signal; and
   a circuit configured to receive the control signal, the first bit-serial data stream, and the second bit-serial data stream, the circuit using the control signal to synchronize to the first bit-serial data stream and the second bit-serial data stream, the circuit further using the control signal to scale and sum the first and second bit-serial data streams to produce an output signal.

2. The fractional decimator with linear interpolation as in claim 1 further comprising an input configured to receive the input signal, the input to divide the input signal into the first portion of the input signal and the second portion of the input signal.

3. The fractional decimator with linear interpolation as in claim 1, wherein the first parallel-to-serial converter and the second parallel-to-serial converter are configured to receive a load data signal, the load data signal to control a rate at which the first parallel-to-serial converter and the second parallel-to-serial converter operate.

4. The fractional decimator with linear interpolation as in claim 3, wherein the input signal comprises parallel formatted data.

5. The fractional decimator with linear interpolation as in claim 4, wherein the first bit-serial data stream and the second bit-serial data stream comprise two's complement bit-serial data at a sample rate that is a fractional multiple of the sample rate of the input signal.

6. The fractional decimator with linear interpolation as in claim 5, wherein the output signal comprises two's complement bit-serial data whose sample-rate is a fraction of an input signal sample rate.

7. The fractional decimator with linear interpolation as in claim 1, wherein the circuit comprises:
   a counter coupled to receive a first portion of the control signal and produce a most significant bit (MSB) control signal and a least significant bit (LSB) control signal;
   a first bit-repeater for scaling the first portion of the input signal in response to a second portion of the control signal, the first bit-repeater for producing a scaled first portion of the input signal;
   a second bit-repeater for scaling the second portion of the input signal in response to the second portion of the control signal, the second bit-repeater for producing a scaled second portion of the input signal;
   a times-two circuit coupled to receive the scaled first portion of the input signal and the scaled second portion of the input signal, the times-two circuit for producing a times-one Past-Present signal in response to the MSB control signal, the times-two circuit for producing a times-two Past-Present signal in response to the MSB control signal and a third portion of the control signal;
   a times-two Past circuit coupled to receive the scaled second portion of the input signal, the times-two Past circuit for producing a times-two Past signal in response to the third portion of the control signal;
   a times-three circuit coupled to receive the scaled first portion of the input signal and the scaled second portion of the input signal, the times-three circuit for producing a times-three Past-Present signal in response to the third portion of the control signal and the MSB control signal;
   a first output multiplexer coupled to receive the times-two Past-Present signal and the times-three Past-Present signal, the first output multiplexer for producing a first intermediate signal in response to the LSB control signal;
   a second output multiplexer coupled to receive the times-two Past signal and the times-one Past-Present signal, the second output multiplexer for producing a second intermediate signal in response to the LSB control signal; and
   a bit-serial adder coupled to receive the first intermediate signal and the second intermediate signal, the bit-serial adder for producing the output signal in response to the third portion of the control signal.

8. The fractional decimator with linear interpolation as in claim 7, wherein the times-two circuit comprises:
   a times-one circuit coupled to receive the scaled first portion of the input signal and the scaled second portion of the input signal, the times-one circuit for producing the times-one Past-Present signal in response to the MSB control signal,
   a bit-serial scaler coupled to receive the times-one Past-Present signal, the bit-serial scaler for producing the times-two Past-Present signal in response to the third portion of the control signal, and
   the times-two Past circuit comprises:
   a bit-serial scaler coupled to receive the scaled second portion of the input signal, the bit-serial scaler for producing the times-two Past signal in response to the third portion of the control signal, and
   the times-three circuit comprises:
   a multiplexer coupled to receive the scaled first portion of the input signal and the scaled second portion of the input signal, the multiplexer for selecting from the scaled first portion of the input signal and the scaled second portion of the input signal in response to the MSB control signal to produce a multiplexed signal,
   a bit-serial scaler coupled to receive the multiplexed signal and producing a scaled multiplexed signal in response to the third portion of the control signal, and
   a bit-serial adder coupled to receive the multiplexed signal and the scaled multiplexed signal, the bit-serial adder for producing the times-three Past-Present signal in response to the third portion of the control signal.

9. The fractional decimator with linear interpolation as in claim 7 further comprising:
   a first reset multiplexer coupled to receive the first portion of the input signal and a reset portion of the control signal, the first reset multiplexer having an output coupled to the first bit-repeater; and
   a second reset multiplexer coupled to receive the second portion of the input signal and the reset portion of the control signal, the second reset multiplexer having an output coupled to the second bit-repeater.

10. A method of fractional decimation with linear interpolation comprising the steps of:

receiving an input signal;

producing a delayed version of the input signal;

converting the input signal to a first bit-serial data stream;

converting the delayed version of the input signal to a second bit-serial data stream;

synchronizing a circuit to the first bit-serial data stream and the second bit-serial data stream; and scaling and summing the first bit-serial data stream and the second bit-serial data stream to produce and output signal.

11. The method of fractional decimation with linear interpolation as in claim 10, wherein the steps of converting the input signal to a first bit-serial data stream and converting the delayed version of the input signal to a second bit-serial data stream comprise the steps of:

applying a load data signal to a first parallel-to-serial converter and a second parallel-to-serial converter;

applying the input signal to the first parallel-to-serial converter; and applying the delayed version of the input signal to the second parallel-to-serial converter.

12. A radiotelephone comprising:

a control logic for controlling the radiotelephone;

a synthesizer for generating RF signals;

a receiver for receiving receive data using the RF signals;

a transmitter for transmitting transmit data using the RF signals, the transmitter including;

a first parallel-to-serial converter configured to receive a first portion of an input signal, the first parallel-to-serial converter to produce a first bit-serial data stream;

a delay element configured to receive a second portion of the input signal, the delay element to produce a delayed second portion of the input signal;

a second parallel-to-serial converter configured to receive the delayed second portion of the input signal, the second parallel-to-serial converter to produce a second bit-serial data stream;

a controller for producing a control signal; and a circuit configured to receive the control signal, the first bit-serial data stream, and the second bit-serial data stream, the circuit using the control signal to synchronize to the first bit-serial data stream and the second bit-serial data stream, the circuit further using the control signal to scale and sum the first and second bit-serial data streams to produce an output signal.

13. The radiotelephone as in claim 12 further comprising an input configured to receive the input signal, the input to divide the input signal into the first portion of the input signal and the second portion of the input signal.

14. The radiotelephone as in claim 13 wherein the first parallel-to-serial converter and the second parallel-to-serial converter are configured to receive a load data signal, the load data signal to control a rate at which the first parallel-to-serial converter and the second parallel-to-serial converter operate.

15. The radiotelephone as in claim 14, wherein the input signal comprises parallel formatted data.

16. The radiotelephone as in claim 15, wherein the first bit-serial data stream and the second bit-serial data stream comprise two's complement bit-serial data at a sample rate that is a fractional multiple of the sample rate of the input signal.

17. The radiotelephone as in claim 16, wherein the output signal comprises two's complement bit-serial data whose sample-rate is a fraction of an input signal sample rate.

18. The radiotelephone as in claim 12, wherein the circuit comprises:

a counter coupled to receive a first portion of the control signal and produce a most significant bit (MSB) control signal and a least significant bit (LSB) control signal;

a first bit-repeater for scaling the first portion of the input signal in response to a second portion of the control signal, the first bit-repeater for producing a scaled first portion of the input signal;

a second bit-repeater for scaling the second portion of the input signal in response to the second portion of the control signal, the second bit-repeater for producing a scaled second portion of the input signal;

a times-two circuit coupled to receive the scaled first portion of the input signal and the scaled second portion of the input signal, the times-two circuit for producing a times-one Past-Present signal in response to the MSB control signal, the times-two circuit for producing a times-two Past-Present signal in response to the MSB control signal and a third portion of the control signal;

a times-two Past circuit coupled to receive the scaled second portion of the input signal, the times-two Past circuit for producing a times-two Past signal in response to the third portion of the control signal;

a times-three circuit coupled to receive the scaled first portion of the input signal and the scaled second portion of the input signal, the times-three circuit for producing a times-three Past-Present signal in response to the third portion of the control signal and the MSB control signal;

a first output multiplexer coupled to receive the times-two Past-Present signal and the times-three Past-Present signal, the first output multiplexer for producing a first intermediate signal in response to the LSB control signal;

a second output multiplexer coupled to receive the times-two Past signal and the times-one Past-Present signal, the second output multiplexer for producing a second intermediate signal in response to the LSB control signal; and a bit-serial adder coupled to receive the first intermediate signal and the second intermediate signal, the bit-serial adder for producing the output signal in response to the third portion of the control signal.

19. The radiotelephone as in claim 18, wherein the times-two circuit comprises:

a times-one circuit coupled to receive the scaled first portion of the input signal and the scaled second portion of the input signal, the times-one circuit for producing the times-one Past-Present signal in response to the MSB control signal, a bit-serial scaler coupled to receive the times-one Past-Present signal, the bit-serial scaler for producing the times-two Past-Present signal in response to the third portion of the control signal, and the times-two Past circuit comprises:

a bit-serial scaler coupled to receive the scaled second portion of the input signal, the bit-serial scaler for producing the times-two Past signal in response to the third portion of the control signal, and the times-three circuit comprises:

a multiplexer coupled to receive the scaled first portion of the input signal and the scaled second portion of the input signal, the multiplexer for selecting from the scaled first portion of the input signal and the scaled second portion of the input signal in response to the MSB control signal to produce a multiplexed signal, a bit-serial scaler coupled to receive the multiplexed signal and producing a scaled multiplexed signal in response to the third portion of the control signal, and a bit-serial adder coupled to receive the multiplexed signal and the scaled multiplexed signal, the bit-serial adder for producing the times-three Past-Present signal in response to the third portion of the control signal.

20. The radiotelephone as in claim 18 further comprising:

a first reset multiplexer coupled to receive the first portion of the input signal and a reset portion of the control signal, the first reset multiplexer having an output coupled to the first bit-repeater; and a second reset multiplexer coupled to receive the second portion of the input signal and the reset portion of the control signal, the second reset multiplexer having an output coupled to the second bit-repeater.

* * * * *